US006399280B1

(12) United States Patent
Vermeersch et al.

(10) Patent No.: US 6,399,280 B1
(45) Date of Patent: Jun. 4, 2002

(54) METHOD FOR MAKING A LITHOGRAPHIC PRINTING PLATE BY A NEGATIVE WORKING NON-ABLATIVE PROCESS

(75) Inventors: Joan Vermeersch, Deinze; Augustin Meisters, Gentbrugge; Stefaan De Meutter, Antwerpen, all of (BE)

(73) Assignee: Agfa-Gevaert, Mortsel (BE)

( * ) Notice: Subject to any disclaimer, the term of this patent is extended or adjusted under 35 U.S.C. 154(b) by 23 days.

(21) Appl. No.: 09/694,674

(22) Filed: Oct. 24, 2000

Related U.S. Application Data

(60) Provisional application No. 60/169,267, filed on Dec. 7, 1999.

(30) Foreign Application Priority Data

Nov. 3, 1999 (EP) ........................................ 99203682

(51) Int. Cl.[7] .......................... G03F 7/36; G03F 7/16; G03F 7/213; B05D 3/00; B05D 5/04

(52) U.S. Cl. ........................ 430/302; 430/97; 430/124; 101/467; 427/550; 427/556; 427/559; 427/208.2; 427/270; 427/130; 427/201

(58) Field of Search ......................... 101/467; 430/97, 430/124, 302; 427/550, 556, 559, 208.2, 270, 130, 201

(56) References Cited

U.S. PATENT DOCUMENTS 5,188,033 A 2/1993 Fadner
6,037,019 A * 3/2000 Kooyer et al. .............. 427/598
6,308,628 B1 * 10/2001 Bronstein et al. ........... 101/467

FOREIGN PATENT DOCUMENTS

CA 2195826 7/1997
GB 1461872 1/1977
JP 8-89890 * 4/1996

OTHER PUBLICATIONS

Machine–Assisted English translation of JP 8–89890 provided by Japan Patent office, Apr. 9, 1996.*
Patent Abstracts of Japan, vol. 012, No. 384 (M–0753), Oct. 13 1988 & JP 63 135248 A (Mitsubishi Heavy Ind. Ltd.), Jun. 7, 1988.

* cited by examiner

*Primary Examiner*—Janet Baxter
*Assistant Examiner*—Sin J. Lee
(74) *Attorney, Agent, or Firm*—Breiner & Breiner, L.L.C.

(57) ABSTRACT

According to the present invention there is provided a method for making a lithographic printing plate comprising the steps of applying a first magnetic field to a dry, light absorbing powder, which comprises a magnetic material and a hydrophobic thermoplastic binder, thereby coating said powder on a surface of a metal support;

image-wise exposing to light the powder in contact with the surface of the metal support, thereby increasing the adhesion of the powder to the surface of the metal support, without substantially ablating the powder; and removing the non-exposed magnetic powder from the surface of the metal support under action of a second magnetic field with a polarity substantially opposite to the first magnetic field.

9 Claims, No Drawings

METHOD FOR MAKING A LITHOGRAPHIC PRINTING PLATE BY A NEGATIVE WORKING NON-ABLATIVE PROCESS

This application claim benefit to Provisional No. 60/169,267 filed Dec. 7, 1999.

FIELD OF THE INVENTION

The present invention relates to a heat-mode method for preparing lithographic printing plates.

More specifically the invention is related to a method for making a lithographic printing plate by a negative working non-ablative process.

BACKGROUND OF THE INVENTION

Rotary printing presses use a so-called master such as a printing plate which is mounted on a cylinder of the printing press. The master carries an image which is defined by the ink accepting areas of the printing surface and a print is obtained by applying ink to said surface and then transferring the ink from the master onto a substrate, which is typically a paper substrate. In conventional lithographic printing, ink as well as an aqueous fountain solution are fed to the printing surface of the master, which is referred to herein as lithographic surface and consists of oleophilic (or hydrophobic, i.e. ink accepting, water repelling) areas as well as hydrophilic (or oleophobic, i.e. water accepting, ink repelling) areas.

Printing masters are generally obtained by the so-called computer-to-film method wherein various pre-press steps such as typeface selection, scanning, colour separation, screening, trapping, layout and imposition are accomplished digitally and each colour selection is transferred to graphic arts film using an image-setter. After processing, the film can be used as a mask for the exposure of an imaging material called plate precursor and after plate processing, a printing plate is obtained which can be used as a master.

In recent years the so-called computer-to-plate method has gained a lot of interest. This method, also called direct-to-plate method, bypasses the creation of film because the digital document is transferred directly to a plate precursor by means of a so-called plate-setter. In the field of such computer-to-plate methods the following improvements are being studied presently:

(i) On-press imaging. A special type of a computer-to-plate process, involves the exposure of a plate precursor while being mounted on a plate cylinder of a printing press by means of an image-setter that is integrated in the press. This method may be called 'computer-to-press' and printing presses with an integrated image-setter are sometimes called digital presses. A review of digital presses is given in the Proceedings of the Imaging Science & Technology's 1997 International Conference on Digital Printing Technologies (Non-Impact Printing 13). Computer-to-press methods have been described in e.g. EP-A 770 495, EP-A 770 496, WO 94001280, EP-A 580 394 and EP-A 774 364. The best known imaging methods are based on ablation. A problem associated with ablative plates is the generation of debris which is difficult to remove and may disturb the printing process or may contaminate the exposure optics of the integrated image-setter. Other methods require processing with chemicals which may damage the electronics and other devices of the press.

(ii) On-press coating. Whereas a plate precursor normally consists of a sheet-like support and one or more functional coatings, computer-to-press methods have been described wherein a composition, which is capable to form a lithographic surface upon image-wise exposure_.and optional processing, is provided directly on the surface of a plate cylinder of the press. EP-A-101 266 describes the coating of a hydrophobic layer directly on the hydrophilic surface of a plate cylinder. After removal of the non-printing areas by ablation, a master is obtained. However, ablation should be avoided in computer-to-press methods, as discussed above. U.S. Pat. No. 5,713,287 describes a computer-to-press method wherein a so-called switchable polymer such as tetrahydro-pyranyl methylmethacrylate is applied directly on the surface of a plate cylinder. The switchable polymer is converted from a first water-sensitive property to an opposite water-sensitive property by image-wise exposure. The latter method requires a curing step and the polymers are quite expensive because they are thermally unstable and therefore difficult to synthesise. EP-A-802 457 describes a hybrid method wherein a functional coating is provided on a plate support that is mounted on a cylinder of a printing press. This method also needs processing. A major problem associated with known on-press coating methods is the need for a wet-coating device which needs to be integrated in the press.

(iii) Elimination of chemical processing. The development of functional coatings which require no chemical processing or may be processed with plain water is another major trend in plate making. WO-90002044, WO-91008108 and EP-A-580 394 disclose such plates, which are, however, all ablative plates. In addition, these methods require typically multi-layer materials, which makes them less suitable for on-press coating. A non-ablative plate which can be processed with plain water is described in e.g. EP-A-770 497 and EP-A-773 112. Such plates also allow on-press processing, either by wiping the exposed plate with water while being mounted on the press or by the fountain solution during the first runs of the printing job.

(iv) Thermal imaging. Most of the computer-to-press methods referred to above use so-called thermal materials, i.e. plate precursors or on-press coatable compositions which comprise a compound that converts absorbed light into heat. The heat which is generated on image-wise exposure triggers a (physico-)chemical process, such as ablation, polymerisation, insolubilisation by cross-linking of a polymer, decomposition, or particle coagulation of a thermoplastic polymer latex. This heat-mode process then results in a lithographic surface consisting of ink accepting and ink repelling areas.

EP-A-786 337 discloses a process for imaging a printing plate, wherein the printing plate is charged over the whole surface and wherein the whole surface is covered with fluid toner particles, which are charged oppositely. Thereon is the layer, formed by the particles imagewise fixed or imagewise ablated by infrared exposure on the surface of the printing plate. Thereafter the parts which are not fixed are removed and optionally the non-ablated areas are fixed by heating over the whole surface of the plate. This process requires a cumbersome development.

OBJECTS OF THE INVENTION

It is an object of the present invention to provide a method for making lithographic printing plates having excellent printing properties, which is suitable for on-press coating and on-press thermal imaging and which does not require chemical processing.

It is still a further object of the invention to provide a heat sensitive imaging material for making lithographic printing plates which can be used in computer to plate application.

Further objects of the present invention will become clear from the description hereinafter.

SUMMARY OF THE INVENTION

According to the present invention there is provided a method for making a lithographic printing plate comprising the steps of applying a first magnetic field to a dry, light absorbing powder, which comprises a magnetic material and a hydrophobic thermoplastic binder, thereby coating said powder on a surface of a metal support;

image-wise exposing to light the powder in contact with the surface of the metal support, thereby increasing the adhesion of the powder to the surface of the metal support without substantially ablating the powder; and removing the non-exposed magnetic powder from the surface of the metal support under action of a second magnetic field with a polarity substantially opposite to the first magnetic field.

DETAILED DESCRIPTION OF THE INVENTION

The metal support is preferably pure aluminum or an aluminum alloy, the aluminum content of which is at least 95%. The thickness of the support usually ranges from about 0.13 to about 0.50 mm.

The preparation of aluminum or aluminum alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but may still improve the printing results. Preferably the aluminum foil has a roughness with a CLA value between 0.2 and 1,5 μm, an anodization layer with a thickness between 0.4 and 2.0 μm and is posttreated.

The roughening of the aluminum foil can be performed according to the methods well known in the prior art. The surface of the aluminum substrate can be roughened either by mechanical, chemical or electrochemical graining or by a combination of these to obtain a satisfactory adhesion of a layer to the aluminum support and to provide a good water retention property to the areas that will form the non-printing areas on the plate surface.

The electrochemical graining process is preferred because it can form a uniform surface roughness having a large average surface area with a very fine and even grain which is commonly desired when used for lithographic printing plates.

The roughening is preferably preceded by a degreasing treatment mainly for removing greasy substances from the surface of the aluminum foil, e.g. by applying a surfactant and/or an aqueous alkaline solution.

Preferably roughening is followed by a chemical etching step using an aqueous solution containing an acid. The chemical etching is preferably carried out at a temperature of at least 30° C. more preferably at least 40° C. and most preferably at least 50° C.

After roughening and optional chemical etching the aluminum foil is anodized which may be carried out as follows.

An electric current is passed through the grained aluminum foil immersed as an anode in a solution containing an acid. An electrolyte concentration from 1 to 70% by weight can be used within a temperature range from 0–70° C. The anodic current density may vary from 1–50 $A/dm^2$ and a voltage within the range 1–100 V to obtain an anodized film weight of 1–8 $g/m^2$ $Al_2O_3.H_2O$. The anodized aluminum foil may subsequently be rinsed with demineralised water within a temperature range of 10–80° C.

The anodised aluminum support may be treated to improve the hydrophilic properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde It is further evident that one or more of these post treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

The magnetic powder comprises a hydrophobic thermoplastic binder, a magnetic material and preferably a release agent. The binder resin used in the present invention may for example include hydrophobic thermoplastic vinyl resins, polyester resins and epoxy resins, Among these, vinyl resins and polyester resins are preferred in view of fixability.

Examples of vinyl monomers to be used for providing a vinyl polymer constituting the binder resin of the present invention may include: Styrene; styrene derivatives, such as o-methylstyrene, m-methylstyrene, p-methylstyrene, p-methoxystyrene, p-phenylstyrene, p-chlorostyrene, 3,4-dichlorostyrene, p-ethylstyrene, 2,4-dimethylstyrene, p-n-butylstyrene, p-tert.-butylstyrene, p-n-hexylstyrene, p-n-octylstyrene, p-n-nonylstyrene, p-n-decylstyrene, and p-n-dodecylstyrene; ethylenically unsaturated olefins, such as ethylene, propylene, butylene and isobutylene; unsaturated polyenes, such as butadiene; halogeneted vinyls, such as vinyl chloride, vinylidene chloride, vinyl bromide and vinyl fluoride; vinyl esters, such as vinyl acetate, vinyl propionate and vinyl benzoate, methacrylates such as methyl methacrylate, ethyl methacrylate, propyl methacrylate, n-butyl methacrylate, isobutyl methacrylate, n-octyl methacrylate, dodecyl methacrylate, 2-ethylhexyl methacrylate, stearyl methacrylate, phenyl methacrylate, dimethylamonoethyl methacrylate and diethylaminoethyl methacrylate; acrylates, such as methyl acrylate, ethyl acrylate, n-butyl acrylate, isobutyl acrylate, propyl acrylate, n-octyl acrylate, dodecyl acrylate, 2-ethylhexyl acrylate, stearyl acrylate, 2-chloroethyl acrylate and phenyl acrylate; vinyl ethers such as vinyl ethyl ether and vinyl isobutyl ether; vinyl ketones, such as vinyl hexyl ketone and methyl isopropenyl ketone; vinyl naphthalenes. These vinyl monomers may be used singly or in combination of two or more species.

Among these, a combination of monomers providing styrene-type copolymers and styrene-acrylic type copolymers may be particularly preferred.

A suitable polyester resin for use in the present invention may preferably have a composition that comprises 45–55 mole % of alcohol component and 55–45 mole % of acid component Examples of the alcohol component may include: diols, such as ethylene glycol, propylene glycol, 1,3-butanediol, 1,4-butanediol, 2,3-butanediol, diethylene glycol, triethylene glycol, 1,5-pentanediol, 1,6-hexanediol, neopentylglycol, 2-ethyl-1,3-hexanediol, hydrogenated bisphenol A.

Examples of the acid constituting at least 50 mole % of the total acid may include benzenedicarboxylic acids, such as phthalic acid, terephthalic acid and isophthalic acid, and their anhydrides; alkyldicarboxylic acids, such as succinic acid, adipinic acid, sebacic acid and azelaic acid, and their anhydrides; $C_6$–$C_{18}$ alkyl or alkenyl-substituted succinic acids, and their anhydrides; and unsaturated dicarboxylic acids, such as fumaric acid, maleic acid, citraconic acid and itaconic acid, and their anhydrides.

Examples of polybasic carboxylic acids having three or more functional groups may include;trimellitic acid, pyromellitic acid, benzophenonetetracarboxylic acid, and their anhydrides.

A preferred polyester for use in the present invention may preferably have a glass transition temperature of 50°–75° C., particularly 55°–65° C., a number-average molecular weight (Mn) of 1,500–50,000, particularly 2,000–20,000, and a weight-average molecular weight of 6,000–100,000, particularly 10,000–90,000 and a diameter between 0.50 and 10 $\mu$m.

Examples of the magnetic material contained in the magnetic powder used in the present invention may include- iron oxides such as magnetite, hematite, and ferrite; iron oxides containing another metal oxide; metals, such as Fe, Co and Ni, and alloys of these metals with other metals , such as Al, Co, Cu, Pb, Mg, Ni, Sn, Zn, Sb, Be, Bi, Cd, Ca, Mn, Se, Ti, W and V; and mixtures of the above.

Specific examples of the magnetic material may include: triiron tetroxide ($Fe_3O_4$), diiron trioxide ($\gamma$-$Fe_2O_3$), zinc iron oxide ($ZnFe_2O_4$), ytrium iron oxide ($Y_3Fe_5O_{12}$), cadmium iron oxide ($CdFe_2O_4$), gadolinium iron oxide ($Gd_3Fe_5O_{12}$), copper iron oxide ($CuFe_2O_4$), Lead iron oxide ($PbFe_{12}O_{19}$), nickel iron oxide ($NiFe_2O_4$), neodymium iron oxide ($NdFe_2O_3$), barium iron oxide ($BaFe_{12}O_{19}$), magnesium iron oxide ($MgFe_2O_4$), manganese iron oxide ($MnFe_2O_4$), lanthanium iron oxide ($LaFeO_3$), powdery iron (Fe), powdery cobalt (Co), and powdery nickel (Ni). The above magnetic materials may be used singly or in mixture of two or more species. Particularly suitable magnetic material for the present invention is fine powder of triiron tetroxide or $\gamma$-diiron trioxide.

The magnetic material preferably shows the following magnetic properties when measured by 10 kilo-Oersted, inclusive of: a coercive force of 20–150 Oersted, a saturation magnetization of 50–200 emu/g, particularly 50–100 emu/g, and a residual magnetization of 2–20 emu/g.

The magnetic material comprises particles having a diameter between 0.50 and 10 $\mu$m.

Preferred compounds capable of converting light into heat are dyes, preferably infrared dyes and pigments, preferably infrared pigments. The powder of the present invention preferably also contains a compound capable of converting light into heat. Alternatively, the magnetic material itself may be used as light absorbing compound.

In the present invention, it is also possible to incorporate one or more species of release agent, as desired within a magnetic powder.

Examples of the release agent may include : aliphatic hydrocarbon waxes, such as low-molecular weight polyethylene, low-molecular weight polypropylene, microcrystaline wax, and paraffin wax, oxidation products of aliphatic hydrocarbon waxes, such as oxidized polyethylene wax, and block copolymers of these; waxes containing aliphatic esters as principal constituent, such as carnabau wax, sasol wax, montanic acid ester wax, and partially or totally deacidified aliphatic esters, such as deacidified carnabau wax. Further examples of the release agent may include: saturated linear aliphatic acids, such as palmitic acid, stearic acid, and montanic acid; unsaturated aliphatic acids, such as brassidic acid, eleostearic acid and palmitiric acid; saturated alcohols, such as stearyl alcohol, arachidic alcohol, behenyl alcohol, carnaubyl alcohol, ceryl alcohol, and melissyl alcohol; aliphatic acid amides, such as linoleyl amide, oleylamide and laurylamide, saturated aliphatic acid bisamides, such as methylene-bisstearylamide, ethylene-biscaprylamide, and ethylene-biscaprylamide; unsaturated aliphatic acid amides, such as ethylene-bisoleylamide, hexamethylene-bisoleylamide, N,N'-dioleyladipoylamide, and N,N'-dioleylsebacoylamide; aromatic bisamides, such as m-xylylenebisstearoylamide, and N,N'- distearylisophthalylamide; grafted waxes obtained by grafting aliphatic hydrocarbon waxes with vinyl monomers, such as styrene and acrylic acid; partially esterified products between aliphatic acids and polyhydric alcohols, such as behenic acid monoglyceride; and methyl ester compounds having hydroxyl group as obtained by hydrogenating vegetable fat and oil.

The release agent may preferably be used in an amount of 0.20 wt. parts, particularly 0.5–10 wt. parts, per 100 wt. parts of the binder resin.

The release agent may be uniformly dispersed in the binder resin by a method of mixing the release agent in a solution of the resin at an elevated temperature under stirring or melt-kneading the binder resin together with the release agent.

The above described metal support was placed in a first magnetic field with the hydrophilic surface located in the direction of the magnetic powder. The polarity of the magnetic field is so that the magnetic powder is attracted to the hydrophilic surface of the support. After covering the hydrophilic surface of the support by the magnetic powder, said imaging element is image-wise or information-wise exposed.

Image-wise exposure in connection with the present invention is preferably an image-wise scanning exposure involving the use of a laser or L.E.D. Preferably used are lasers that operate in the infrared or near-infrared, i.e. wavelength range of 700–1500 nm. Most preferred are laser diodes emitting in the near-infrared.

After said image-wise exposure, the imaging element was freed of magnetic powder on the non-exposed areas by applying a magnetic field with the substantially opposite polarity of the first field to said imaging element.

According to the present invention the plate is then ready for printing without an additional development and can be mounted on the printing press.

Alternatively, some or all of the above steps can be performed on-press, i.e. after mounting the support on the press.

The following example illustrates the present invention without limiting it thereto. All parts and percentages are by weight unless otherwise specified.

EXAMPLES

An aluminum support was electrochemically grained using hydrochloric acid, anodized in sulphuric acid and subsequently treated with polyvinylphosphonic acid.

The above described aluminum support was placed together with a dry magnetic powder in a first magnetic field in such a way that the magnetic powder is attracted to the hydrophylic surface of the aluminum support.

Two types of magnetic powder were used

1. Canon(type CB 743) contains magnetite, a binder with a release agent.
2. Agfa (Type T19076) contains 48.6% polyester, 16.2% copolymer of styrene/acrylate, 34% magnetite and 1.2% release agent (wax).

Subsequently the aluminum support covered with one of the magnetic powders was exposed with an 830 nm diode laser (Isomet-3600 dpi-spot size 11 μm-at a speed of 3.2 m/s; i.e. pixel dwell time of 3.4 μs; the image plane power was varied: 80 mW-190 mW-292 mW were used). The same aluminum supports were also exposed with an 1060 nm NdYLF laser (Isomet-spot size 18 μm-speed 3.2 m/s; the power was varied between 250 mW and 750 mW).

On the non exposed parts, the magnetic powder was removed by applying a second magnetic field with an opposite polarity as the first magnetic field. The thus obtained printing plates were mounted on a conventional offset printing machine equipped with a conventional ink and fountain solution. Printing was started without any further treatment, and resulted in good prints with good image quality.

What is claimed is:

1. A method for making a lithographic printing plate comprising the steps of applying a first magnetic field to a dry, light absorbing powder, which comprises a magnetic material and a hydrophobic thermoplastic binder, thereby coating said powder on a surface of a metal support;

image-wise exposing to light the powder in contact with the surface of the metal support, thereby increasing the adhesion of the powder to the surface of the metal support, without substantially ablating the powder; and removing the non-exposed magnetic powder from the surface of the metal support under action of a second magnetic field with a polarity substantially opposite to the first magnetic field.

2. A method according to claim 1 wherein the magnetic material comprises particles having a diameter between 0.50 and 10 μm.

3. A method according to claim 1 wherein said powder comprises a near-infrared light absorbing substance.

4. A method according to claim 1 wherein the binder comprises a hydrophobic thermoplastic vinyl resin.

5. A method according to claim 1 wherein the binder comprises a hydrophobic thermoplastic polyester resin.

6. A method according to claim 4 wherein the vinyl resin is a compound selected from the group consisting of polystyrene and polyacrylate.

7. A method according to claim 1 wherein the metal support is an anodized aluminum foil.

8. A method according to claim 1 wherein the powder comprises a release agent.

9. A method according to claim 1 wherein any or all of the steps are performed on-press.

* * * * *